(12) United States Patent
Li et al.

(10) Patent No.: US 8,227,828 B2
(45) Date of Patent: *Jul. 24, 2012

(54) LED ARRAY PACKAGE COVERED WITH A HIGHLY THERMAL CONDUCTIVE PLATE

(75) Inventors: Jianhua Li, Fremont, CA (US); Rene Helbing, Palo Alto, CA (US); David Hum, San Bruno, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/958,303

(22) Filed: Dec. 1, 2010

(65) Prior Publication Data
US 2011/0073878 A1    Mar. 31, 2011

Related U.S. Application Data

(63) Continuation of application No. 12/487,453, filed on Jun. 18, 2009, now Pat. No. 7,855,394.

(51) Int. Cl.
*H01L 33/00* (2010.01)
(52) U.S. Cl. ...... 257/98; 257/99; 257/100; 257/E33.061; 257/E33.075
(58) Field of Classification Search .................... 257/98, 257/99, 100, E33.061, E33.075
See application file for complete search history.

(56) References Cited

U.S. PATENT DOCUMENTS

| 2009/0322197 A1* | 12/2009 | Helbing | 313/46 |
| 2009/0322205 A1* | 12/2009 | Lowery | 313/493 |
| 2010/0140655 A1* | 6/2010 | Shi | 257/99 |

* cited by examiner

*Primary Examiner* — Minh-Loan T Tran
(74) *Attorney, Agent, or Firm* — Arent Fox LLP (57) ABSTRACT

A light source includes a substrate, a light emitting diode on the substrate, and a phosphor layer over the light emitting diode. A plate is on the phosphor layer. An attachment member is coupled to the plate and is configured to conduct heat away from the plate.

12 Claims, 15 Drawing Sheets

LED ARRAY PACKAGE COVERED WITH A HIGHLY THERMAL CONDUCTIVE PLATE

CROSS-REFERENCE TO RELATED APPLICATION

This application is a continuation of U.S. patent application Ser. No. 12/487,453 filed in the United States Patent and Trademark Office on Jun. 18, 2009, now U.S. Pat. No. 7,855,394 the entire content of which is incorporated herein by reference.

BACKGROUND

1. Field

The present disclosure relates to a light emitting diode (LED) array package and, more particularly, to an LED array package with a highly thermal conductive plate.

2. Description of Related Art

LEDs have been developed for many years and have been widely used in various light applications. As LEDs are lightweight, consume less energy, and have a good electrical power to light conversion efficiency, they have been used to replace conventional light sources, such as incandescent lamps and fluorescent light sources. LEDs may be utilized in an array package. For LED array packages, the temperature of a top surface of the package can reach 200° C. or more, which can damage the device. As such, there is a need in the art to improve the heat dissipation performance of LED array packages.

SUMMARY

In one aspect of the disclosure, a light source includes a substrate, a light emitting diode on the substrate, and a phosphor layer over the light emitting diode. A plate is on the phosphor layer. An attachment member is coupled to the plate and is configured to conduct heat away from the plate.

In another aspect of the disclosure, a light source includes a substrate, a light emitting diode on the substrate, and a phosphor layer over the light emitting diode. The light source further includes first means for conducting heat away from the phosphor layer and second means for securing the first means to the light source and for conducting heat away from the first means.

It is understood that other aspects of an LED package (or LED array package) will become readily apparent to those skilled in the art from the following detailed description, wherein it is shown and described only exemplary configurations of an LED array package. As will be realized, the invention includes other and different aspects of an LED array package and the various details presented throughout this disclosure are capable of modification in various other respects, all without departing from the spirit and scope of the invention. Accordingly, the drawings and the detailed description are to be regarded as illustrative in nature and not as restrictive.

DETAILED DESCRIPTION

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element. In addition, when a first element is "coupled" to a second element, the first element may be directly connected to the second element or the first element may be indirectly connected to the second element with intervening elements between the first and second elements.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can therefore encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various aspects of an LED array package may be illustrated with reference to one or more exemplary configurations. As used herein, the term "exemplary" means "serving as an example, instance, or illustration," and should not necessarily be construed as preferred or advantageous over other configurations of an LED array package disclosed herein.

Furthermore, various descriptive terms used herein, such as "on" and "transparent," should be given the broadest meaning possible within the context of the present disclosure. For example, when a layer is said to be "on" another layer, it should be understood that that one layer may be deposited, etched, attached, or otherwise prepared or fabricated directly or indirectly above or below that other layer. In addition, something that is described as being "transparent" should be understood as having a property allowing no significant obstruction or absorption of electromagnetic radiation in the particular wavelength (or wavelengths) of interest, unless a particular transmittance is provided.

Figure 1:
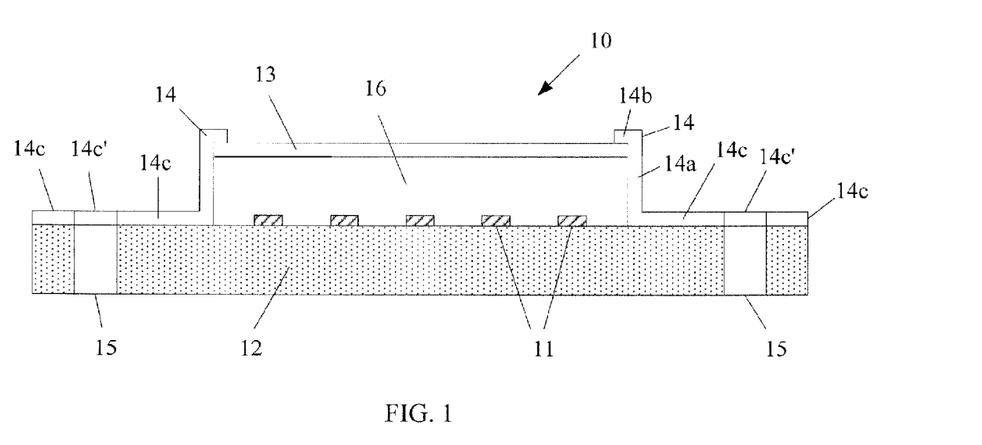
FIG. 1 is a cross-section view of a first example of an LED array package according to a first configuration.

FIG. 1 is a cross-section view of a first example of an LED array package 10 according to a first configuration. An LED is a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, which is referred to as n-type or a p-type semiconductor region, respectively. In LED applications, the semiconductor includes an n-type semiconductor region and a p-type semiconductor region. A reverse electric field is created at the junction between the two regions, which cause the electrons and holes to move away from the junction to form an active region. When a forward voltage sufficient to overcome the reverse electric field is applied across the p-n junction, electrons and holes are forced into the active region and combine. When electrons combine with holes, they fall to lower energy levels and release energy in the form of light.

The light source may be configured to produce white light. White light may enable the light source to act as a direct replacement for conventional light sources used today in incandescent and fluorescent light sources. There are at least two common ways for producing white light. One way is to use individual LEDs that emit red, green, and blue, and then mix all the colors to produce white light. The other way is to use a phosphor material to convert monochromatic light emitted from a blue or ultra-violet (UV) LED to broad-spectrum white light. The present invention, however, may be practiced with other LED and phosphor combinations to produce different color lights.

As shown in FIG. 1, an array of LEDs 11 is on substrate 12. The array of LEDs 11 may be covered with a layer 16 of a mixture of silicone and phosphor. U.S. patent application Ser. No. 12/164,506, entitled "A Light Emitting Device Having A Phosphor Layer" and which is herein incorporated by reference, provides several different additional configurations for the phosphor layer. A highly thermal conductive and transparent plate 13 is attached to a top surface of the LED array package 10 on the phosphor layer 16. The plate 13 may be a sapphire plate, a silicone carbide (SiC) plate, a chemical-vapor-deposition (CVD) diamond plate, CVD SiC on a glass plate, CVD diamond on a glass plate, a glass plate, a zinc oxide (ZnO) plate, a quartz plate, or any of the aforementioned types of plates with a metal net (see FIG. 10). The plate 13 is secured to the phosphor layer by attachment member(s) 14. The attachment member 14 includes a vertical member 14a that extends between the substrate 12 and the plate 13. The attachment member may further include a flange 14b that fits over and secures the plate 13. The attachment member 14 may be metal, such as aluminum, silver, copper, or another highly thermal conductive metal. The attachment member 14 may be in the shape of a ring and thermally bonded with the plate 13. The attachment member 14 may surround the LED array package 10 and have an extrusion 14c that extends parallel to the substrate 12 so that it can be thermally attached to the substrate 12. The extrusion 14c may include holes 14c', which allow the LED array package 10 to be attached to a heat sink on a bottom surface of the substrate 12 through aligned holes 15 in the substrate 12. The attachment member 14 may be secured to the substrate 12 with a thermal pad, epoxy, solder, or another adhesive, or may be secured with screws, bolts, or other fasteners through holes 14c'. Once the LED array package 10 is secured to a heat sink, the holes 14c', 15 may be filled with thermal grease or paste, thus providing a good thermal dissipation path from the plate 13, through the attachment member 14, to an attached heat sink. While FIG. 1 shows an array of LEDs, the plate 13 and attachment member 14 may be utilized with any number of LEDs including just one LED.

As discussed supra, for LED array packages, the temperature of a top surface of the LED array package 10 can reach 200° C. or more. The high temperature can significantly reduce the quantum efficiency of the phosphor or damage the whole device. With a 5×5 LED array package, the top surface of the LED array package can be significantly reduced with the highly thermal conductive plate 13 and an aluminum ring-shaped attachment member 14, as shown in FIG. 1.

Figure 2:
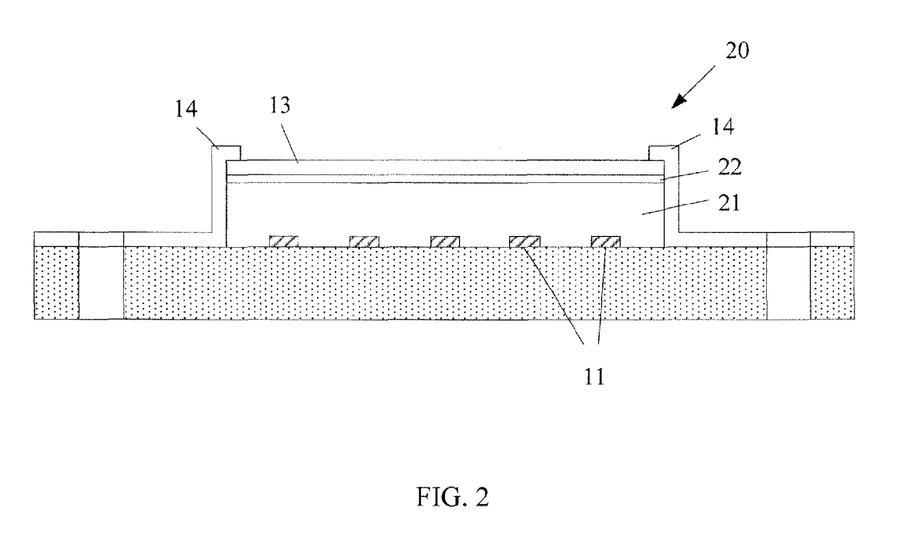
FIG. 2 is a cross-section view of a second example of an LED array package.

FIG. 2 is a cross-section view of a second example of an LED array package 20. As shown in FIG. 2, the plate 13 and the attachment member 14 may be utilized with an LED array package 20 with a clear silicone layer 21 covering the LEDs 11 and a thin-film layer of phosphor 22 on the clear silicone layer 21.

Figure 3:
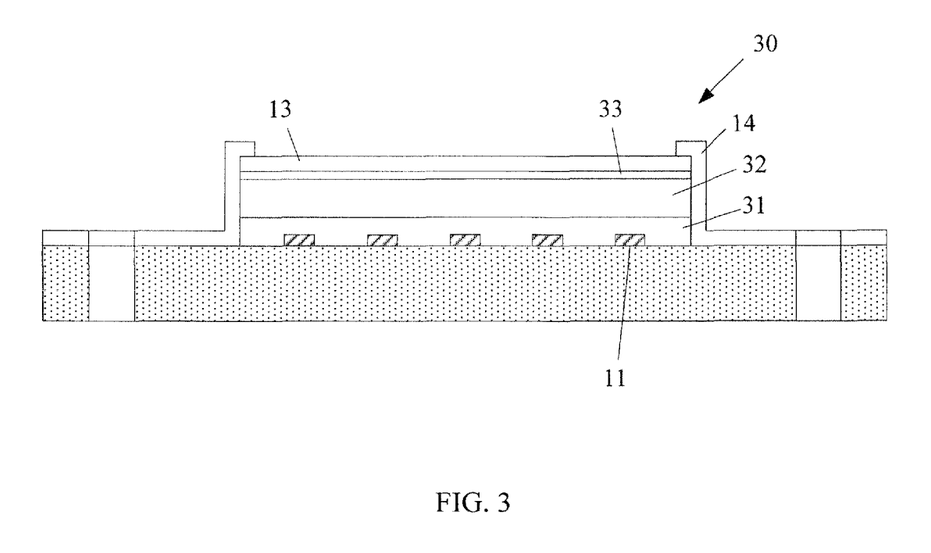
FIG. 3 is a cross-section view of a third example of an LED array package.

FIG. 3 is a cross-section view of a third example of an LED array package 30. As shown in FIG. 3, the plate 13 and the attachment member 14 may be utilized with an LED array package 30 with a clear silicone layer 31 covering the LEDs 11, a thin-film layer of phosphor 33 attached to a bottom surface of the plate 13, and an intervening open air space 32 between the clear silicone layer 31 and the thin-film layer of phosphor 33.

Figure 4:
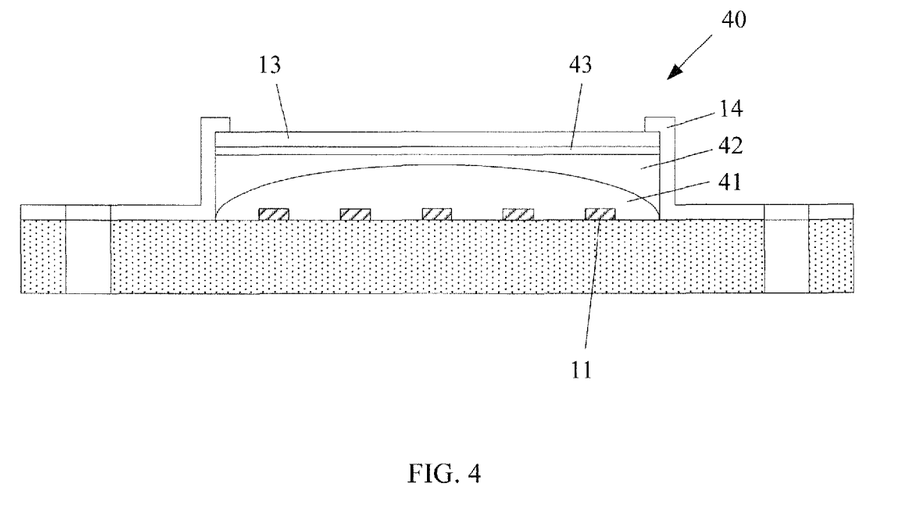
FIG. 4 is a cross-section view of a fourth example of an LED array package.

FIG. 4 is a cross-section view of a fourth example of an LED array package 40. As shown in FIG. 4, the plate 13 and the attachment member 14 may be utilized with an LED array package 40 with a clear silicone dome layer 41 covering the LEDs 11, a thin-film layer of phosphor 43 attached to the bottom surface of the plate 13, and an intervening open air space 42 between the clear silicone dome layer 41 and the thin-film layer of phosphor 43. The LEDs 11 may be blue LEDs. The clear silicone dome layer 41 extracts more blue light from the LED dies 11, as less light is internally reflected at the interface of the air 42 and the clear silicone 41.

Figure 5:
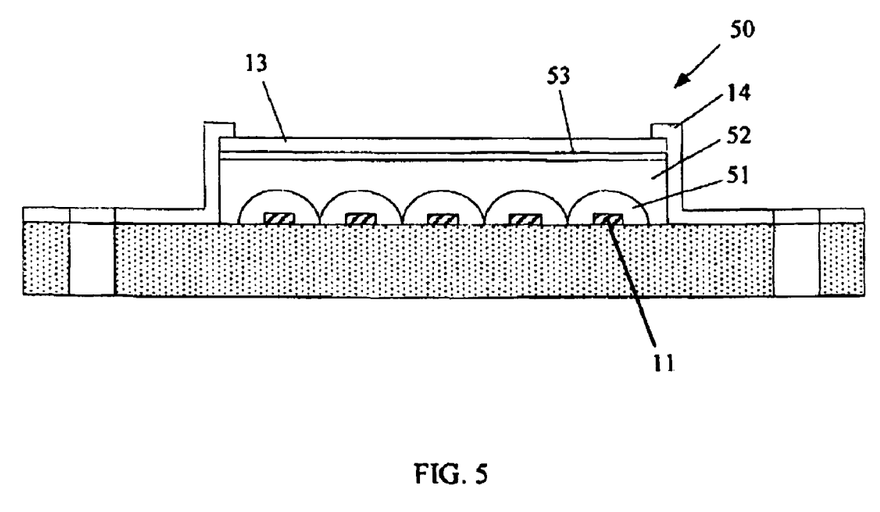
FIG. 5 is a cross-section view of a fifth example of an LED array package.

FIG. 5 is a cross-section view of a fifth example of an LED array package 50. As shown in FIG. 5, the plate 13 and the attachment member 14 may be utilized with an LED array package 50 with a clear silicone dome (or half-ball lens) array 51 covering the LEDs 11, a thin-film layer of phosphor 53 attached to the bottom surface of the plate 13, and an intervening open air space 52 between the clear silicone dome array 51 and the thin-film layer of phosphor 53. As discussed supra, the LEDs 11 may be blue LEDs. The clear silicone dome array 51 extracts more blue light from the LED dies 11, as less light is internally reflected at the interface of the air 52 and the clear silicone 51.

Figure 6:
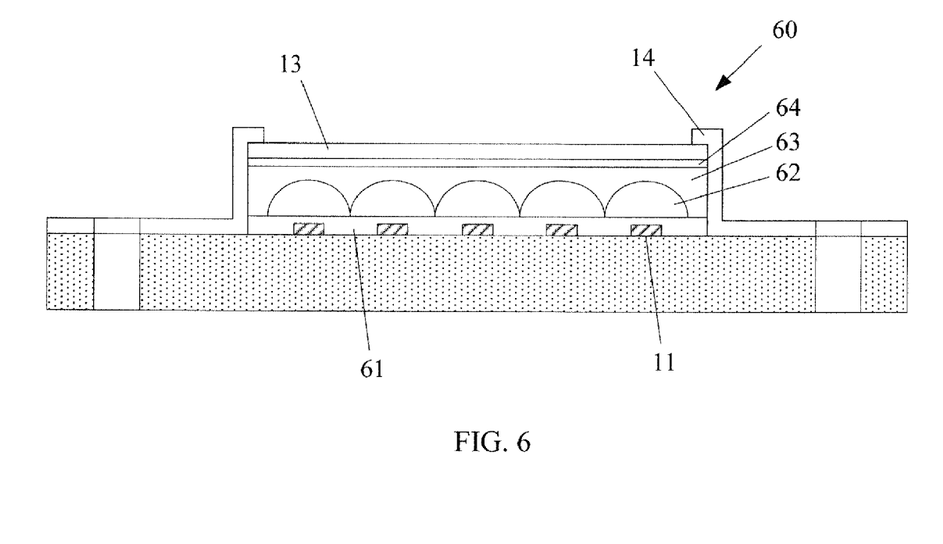
FIG. 6 is a cross-section view of a sixth example of an LED array package.

FIG. 6 is a cross-section view of a sixth example of an LED array package 60. As shown in FIG. 6, the plate 13 and the attachment member 14 may be utilized with an LED array package 60 with a clear silicone layer 61 covering the LEDs 11, a clear dome (or half-ball lens) array 62 bonded onto the clear silicone layer 61, a thin-film layer of phosphor 64 attached to the bottom surface of the plate 13, and an intervening open air space 63 between the clear silicone layer 61 and the thin-film layer of phosphor 64. The clear dome array 62 may be silicone, preformed glass, or preformed plastic such as polymethylmethacrylate (PMMA), polycarbonate, acrylic, or another transparent material. As discussed supra, the LEDs 11 may be blue LEDs. The clear dome array 62 extracts more blue light from the LED dies 11, as less light is internally reflected at the interface of air 52 and the clear dome array 62.

Figure 7:
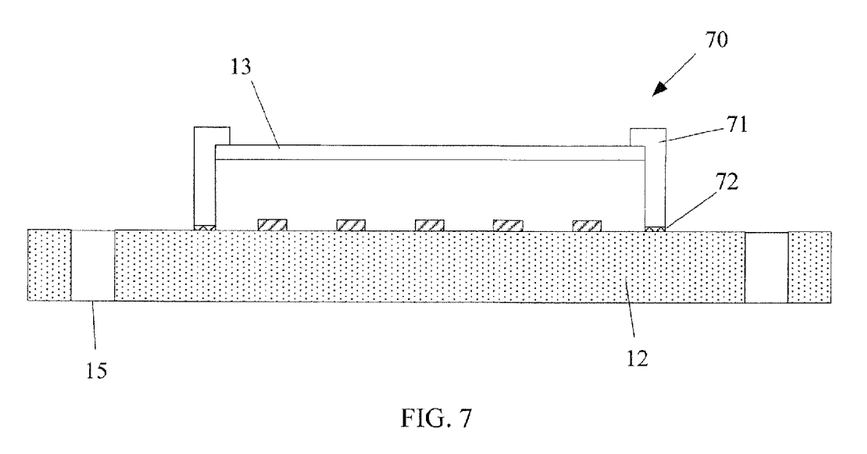
FIG. 7 is a cross-section view of an LED array package according to a second configuration.

FIG. 7 is a cross-section view of an LED array package 70 according to a second configuration. As shown in FIG. 7, the attachment member 71 may not include the extrusions of the attachment member 14. The attachment member 71 may be attached to the substrate 12 with an epoxy, solder, or another adhesive 72 attached between the substrate 12 and the attachment member 71.

Figure 8:
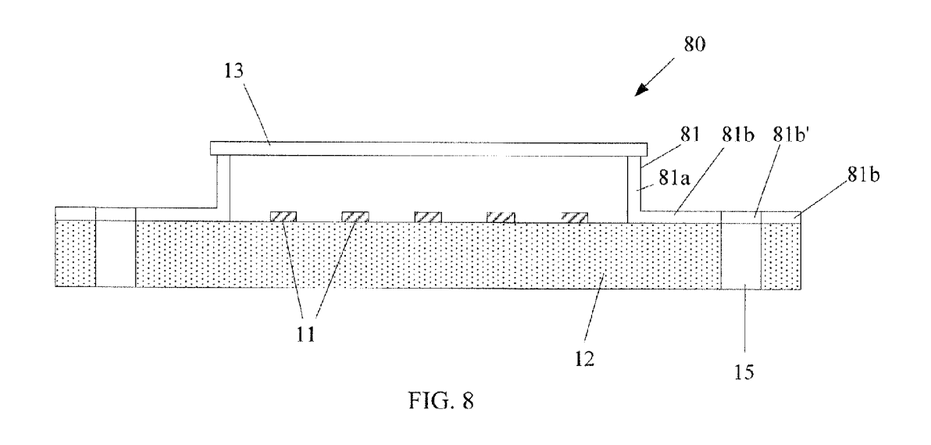
FIG. 8 is a cross-section view of an LED array package according to a third configuration.

FIG. 8 is a cross-section view of an LED array package 80 according to a third configuration. As shown in FIG. 8, an array of LEDs 11 is on substrate 12. A plate 13 may be attached to a top surface of the attachment member 81. The plate 13 may be attached to the attachment member 81 with epoxy, solder, or another adhesive. The attachment member 81 includes a vertical member 81a that extends between the substrate 12 and the plate 13. The attachment member 81 may be metal, in the shape of a ring, and thermally bonded with the plate 13. The attachment member 81 may surround the LED array package 80 and have an extrusion 81b that extends parallel to the substrate 12 so that it can be thermally attached to the substrate 12. The extrusion 81b may include holes 81b', which allow the LED array package 80 to be attached to a heat sink on a bottom surface of the substrate 12 through aligned holes 15 in the substrate 12. The attachment member 81 may be secured to the substrate 12 with a thermal pad, epoxy, solder, or another adhesive, or may be secured with screws, bolts, or other fasteners through holes 81b', 15. Once the LED array package 80 is secured to a heat sink, the holes 81b' may be filled with thermal grease or paste, thus providing a good thermal dissipation path from the plate 13 to an attached heat sink.

Figure 9:
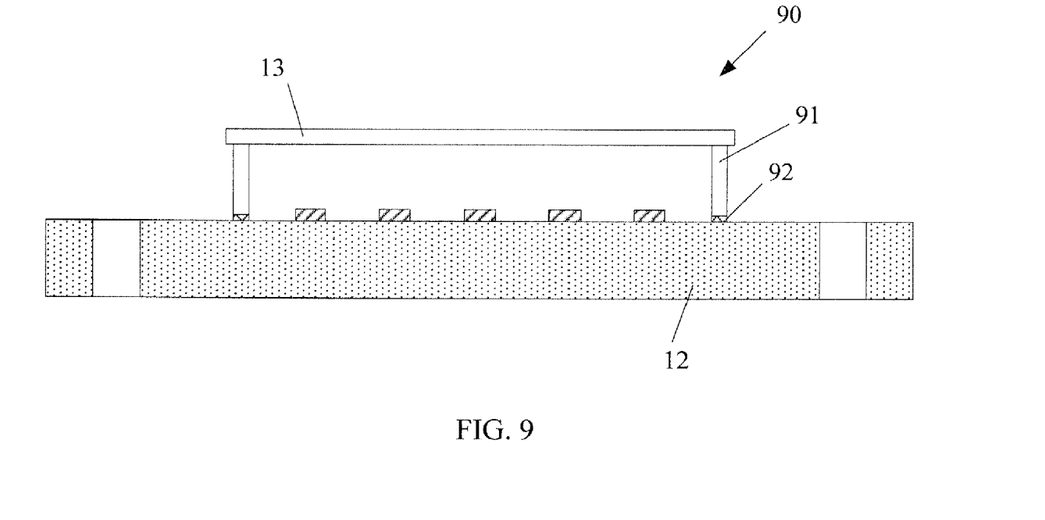
FIG. 9 is a cross-section view of an LED array package according to a fourth configuration.

FIG. 9 is a cross-section view of an LED array package 90 according to a fourth configuration. As shown in FIG. 9, the attachment member 91 may not include the extrusions of the attachment member 81. The attachment member 91 may be attached to the substrate 12 with an epoxy, solder, or another adhesive 92 attached between the substrate 12 and the attachment member 91.

Figure 10:
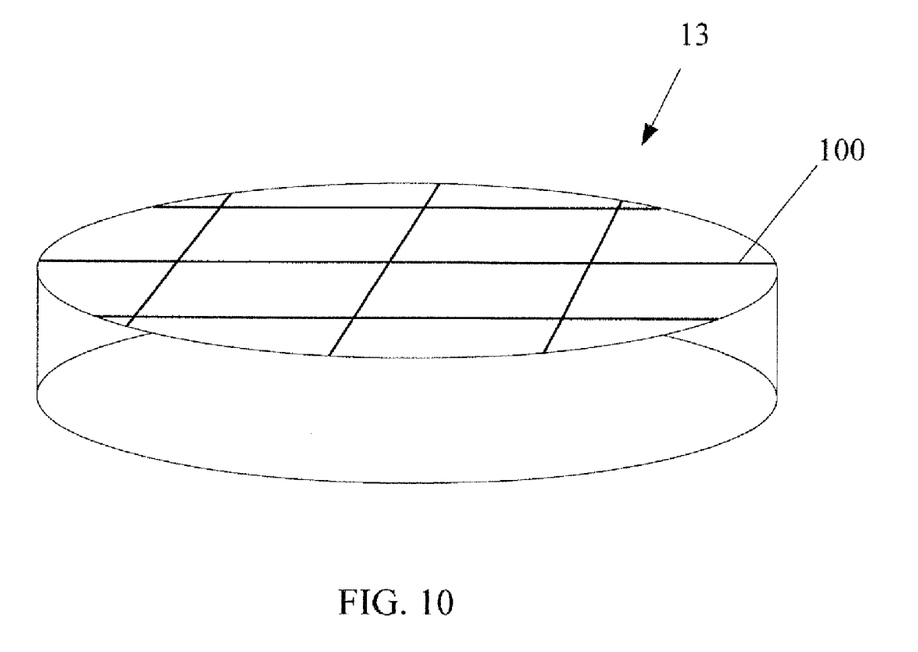
FIG. 10 is a perspective view of the conductive glass plate.

FIG. 10 is a perspective view of the highly thermal conductive plate 13. As shown in FIG. 10, the plate 13 may include a metal net 100 on a top surface. The metal net 100 may be aluminum, copper, silver, or another highly thermally conductive metal. The metal net 100 may be on an outer surface of the plate 13, as shown in FIG. 10, or may be within the glass plate 13.

Figure 11:
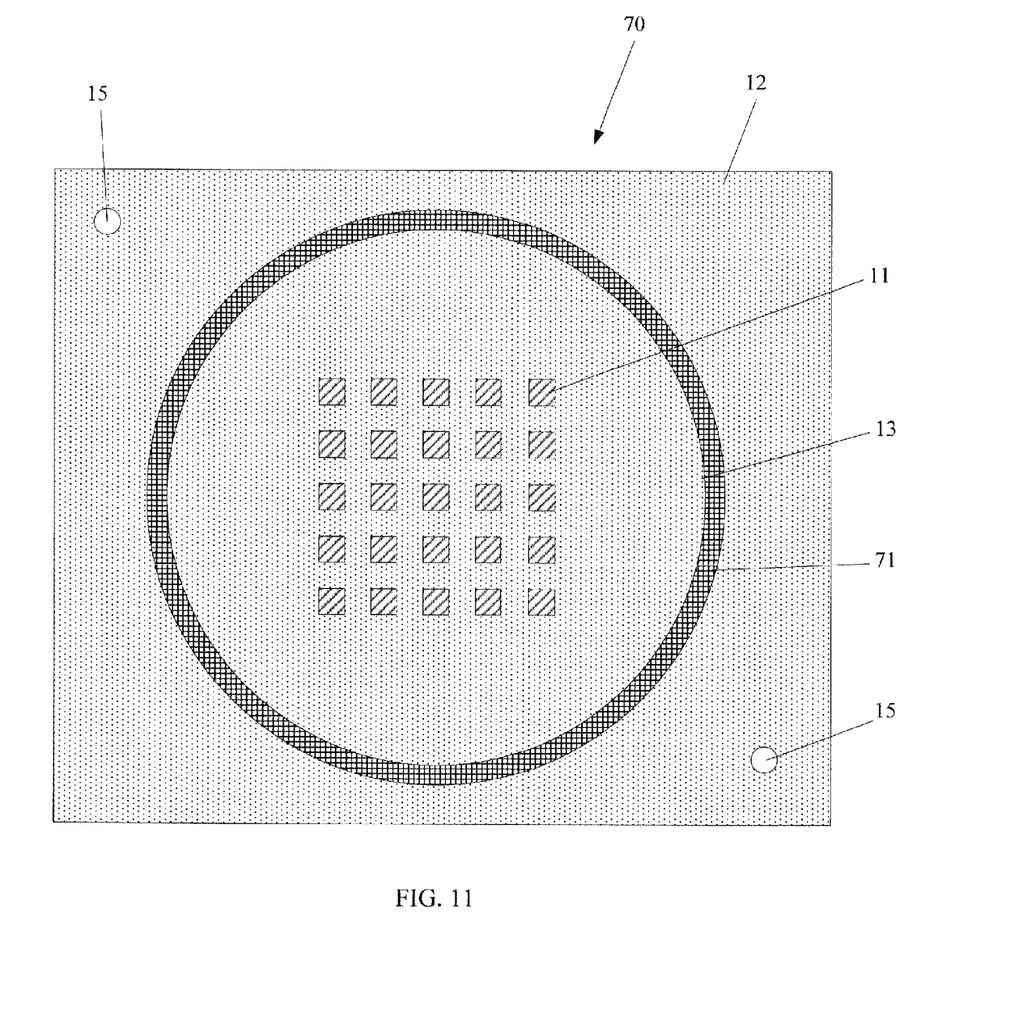
FIG. 11 is a top view of the LED array package of FIG. 7.

FIG. 11 is a top view of the LED array package 70 of FIG. 7. As shown in FIG. 11, the LED array package 70 includes a 5×5 array of LEDs 11 on substrate 12. The ring-shaped attachment member 71 surrounds the LED array to secure the plate 13 (transparent in FIG. 11) on a top surface of the LED array and to conduct heat away from the plate 13. Holes 15 allow the LED array package 70 to be secured to a heat sink. Although FIG. 11 shows the attachment member 71 in the shape of a ring, the attachment member 71 may be separate components and may not entirely surround the LED array. In an alternate configuration, two or more components may be utilized to secure the plate 13 to the LED array package 70 at specific points along the edge of the plate 13.

Figure 12:
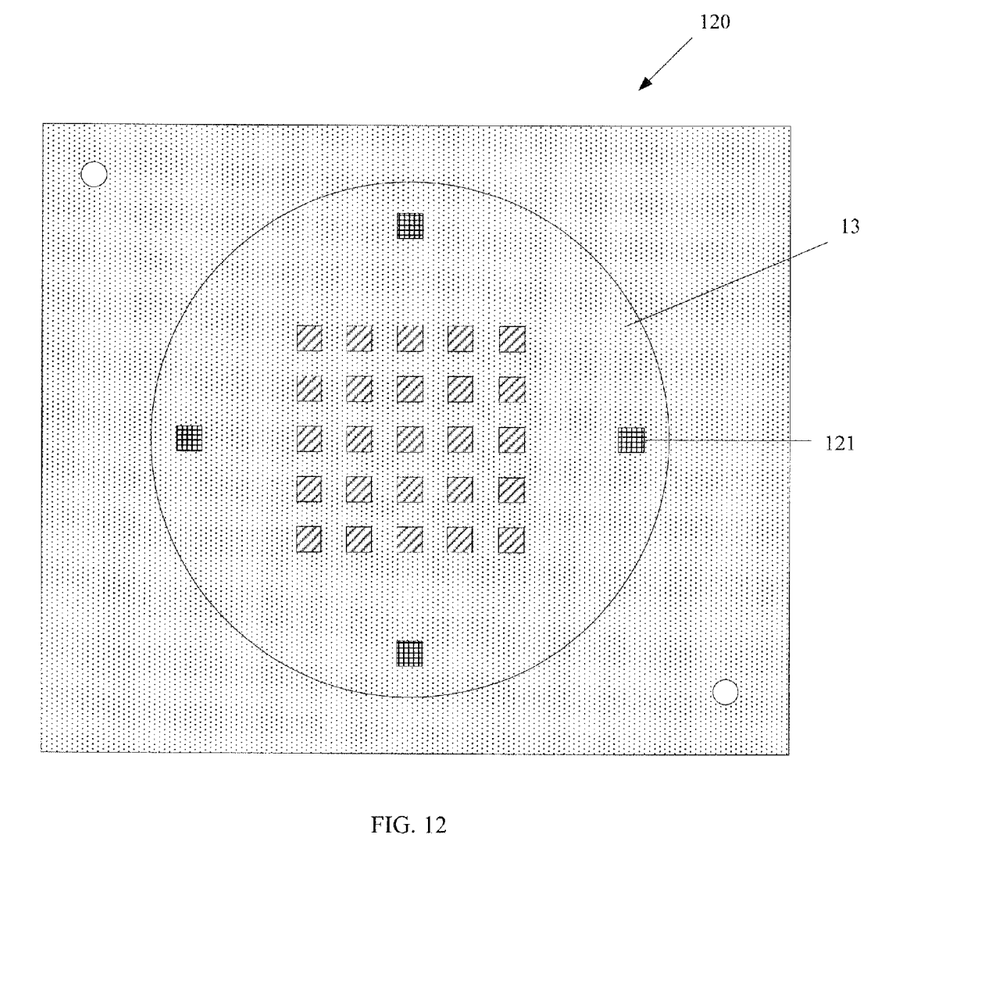
FIG. 12 is a top view of an LED array package according to a fifth configuration.

FIG. 12 is a top view of an LED array package 120 according to a fifth configuration. Alternatively, as shown in FIG. 12, the LED array package 120 may include metal columns/walls 121 outside the LED array, and the plate 13 (transparent in FIG. 12) may be secured to the metal columns/walls 121 with epoxy, solder, or another adhesive.

One of ordinary skill in the art would understand that the configurations of a silicone layer, a phosphor layer, and any intervening open air space over the LEDs 11 applies also to the second through fifth configurations of the attachment member. Furthermore, one of ordinary skill in the art would understand that the configurations can apply to any number of LEDs on a substrate, and therefore the configurations apply to a light emitting diode as well as to a light emitting diode array.

In one configuration, a light source includes a substrate, a light emitting diode on the substrate, a phosphor over the light emitting diode, a first means for conducting heat away from the phosphor layer, and a second means for securing the first means to the light source and for conducting heat away from the first means. The first means is the plate 13. The second means may be the attachment member 14 (FIGS. 1-6), 71 (FIGS. 7, 11), 81 (FIG. 8), or 91 (FIG. 9) or may be the walls/columns 121 that extend vertically from the substrate as shown in FIG. 12.

Figure 13:
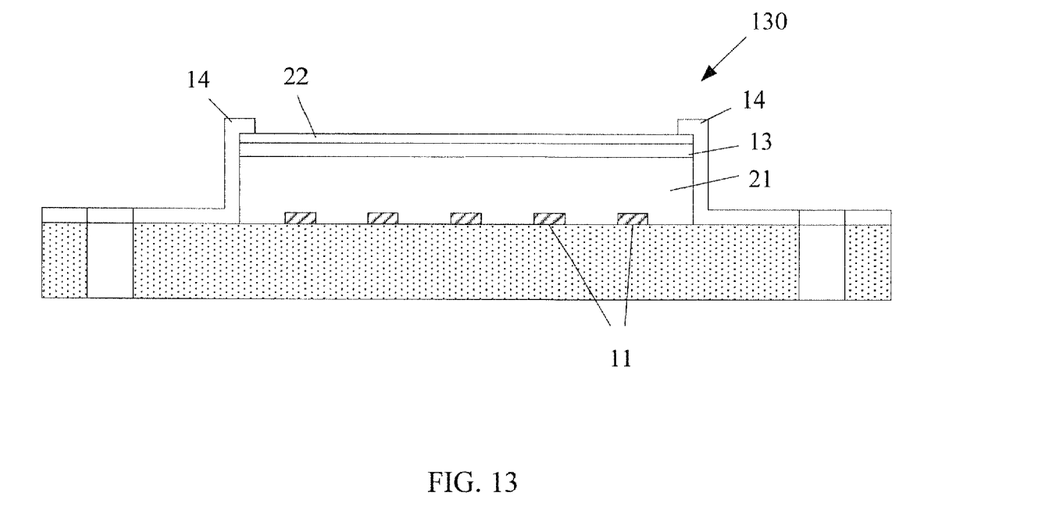
FIG. 13 is a cross-sectional view of an LED array package according to a sixth configuration.
Figure 14:
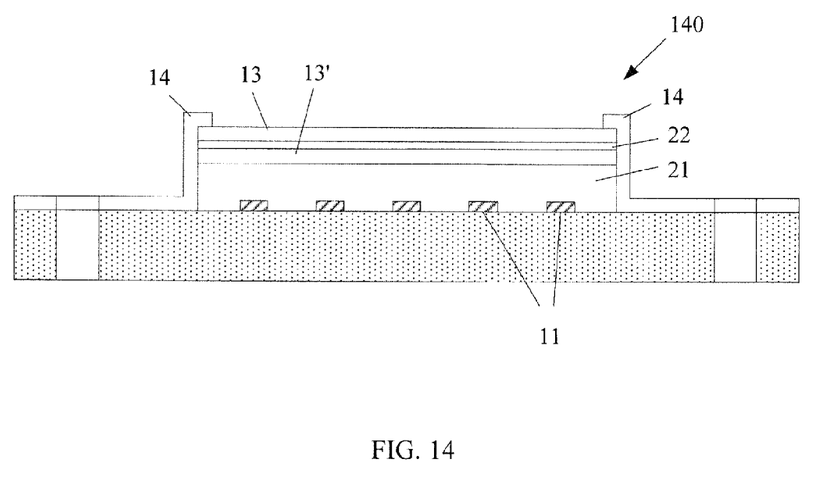
FIG. 14 is a cross-sectional view of an LED array package according to a seventh configuration.
Figure 15:
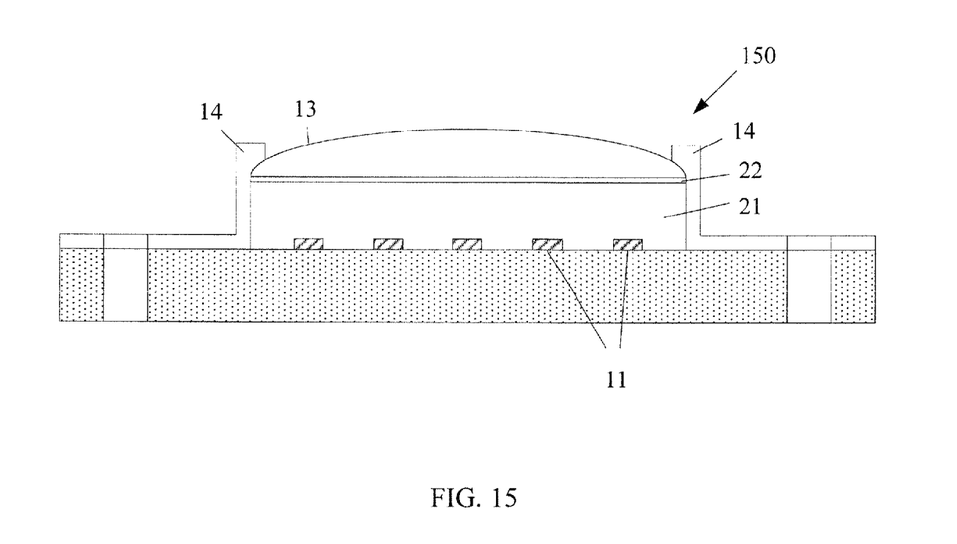
FIG. 15 is a cross-sectional view of an LED array package according to an eighth configuration.

FIGS. 13, 14, and 15 are cross-sectional views of LED array packages according to additional configurations. As shown in FIG. 13, the plate 13 can be located between the phosphor layer 22 and the LEDs 11. As shown in FIG. 14, an additional plate 13' may be located below the phosphor layer 22, with the phosphor layer 22 sandwiched between the plate 13 and the plate 13'. As shown in FIG. 15, the plate 13 and the phosphor layer 22 can be dome-shaped.

The various aspects of this disclosure are provided to enable one of ordinary skill in the art to practice the present invention. Modifications to various aspects of an LED array package presented throughout this disclosure will be readily apparent to those skilled in the art, and the concepts disclosed herein may be extended to other applications. Thus, the claims are not intended to be limited to the various aspects of an LED array package presented throughout this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light source, comprising:
   a substrate;
   a light emitting diode on the substrate;
   a phosphor layer over the light emitting diode;
   first means for conducting heat away from the phosphor layer, wherein the first means comprises a plate comprising at least one of a sapphire plate, a silicon carbide plate, a chemical-vapor-deposition diamond plate, a chemical-vapor-deposition silicon carbide on glass plate, a chemical-vapor-deposition diamond on glass plate, and a glass plate; and
   second means for securing the first means to the light source and for conducting heat away from the first means, wherein the second means comprises a ring-shaped vertical member extending approximately perpendicular and attached to the substrate, wherein
   the ring-shaped vertical member comprises an extrusion extending outwardly from a bottom portion of the ring-shaped vertical member approximately parallel to the substrate to attach to the substrate; and
   the plate is attached to a top surface of the ring-shaped vertical member.

2. The light source of claim 1, wherein the first means is transparent.

3. The light source of claim 1, wherein the first means contacts the phosphor layer.

4. The light source of claim 1, wherein the plate further comprises a metal net.

5. The light source of claim 1, wherein the second means is metal.

6. The light source of claim 1, wherein the ring-shaped vertical member is attached to the substrate with an adhesive.

7. The light source of claim 1, wherein the extrusion is attached to the substrate with an adhesive.

8. The light source of claim 1, wherein the extrusion and the substrate each have at least one hole that are aligned together.

9. The light source of claim 1, wherein:
   the ring-shaped vertical member comprises a flange extending inwardly from a top portion of the ring-shaped vertical member approximately parallel to the substrate;
   a bottom surface of the ring-shaped vertical member is attached to the substrate with an adhesive; and
   the flange extends over an edge of the plate to secure the plate to the light source.

10. The light source of claim 1, wherein:
    the ring-shaped vertical member comprises a flange extending inwardly from a top portion of the ring-shaped vertical member approximately parallel to the substrate, and an extrusion extending outwardly from a bottom portion of the ring-shaped vertical member approximately parallel to the substrate; and
    the flange extends over an edge of the plate to secure the plate to the light source.

11. The light source of claim 1, wherein the vertical member comprises at least one column or wall and the plate is attached to said at least one column or wall.

12. The light source of claim 1, further comprising at least one additional light emitting diode on the substrate; wherein said light emitting diode and said at least one additional light emitting diode are in an array on the substrate, and said phosphor layer is also over said at least one additional light emitting diode.

* * * * *